(12) United States Patent
Lu et al.

(10) Patent No.: US 7,327,343 B2
(45) Date of Patent: Feb. 5, 2008

(54) DISPLAY DRIVING CIRCUIT

(75) Inventors: Shi-Hsiang Lu, Taipei (TW); Jian-Shen Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 386 days.

(21) Appl. No.: 10/604,173

(22) Filed: Jun. 30, 2003

(65) Prior Publication Data
US 2004/0207590 A1 Oct. 21, 2004

(30) Foreign Application Priority Data
Apr. 16, 2003 (TW) .............................. 92108770 A

(51) Int. Cl.
G09G 3/10 (2006.01)
(52) U.S. Cl. ............................ 345/100; 345/93; 377/64
(58) Field of Classification Search .......... 345/87–101, 345/204–205, 211–213; 377/64, 68
See application file for complete search history.

(56) References Cited

U.S. PATENT DOCUMENTS

| | | | | |
|---|---|---|---|---|
| 5,063,378 A | * | 11/1991 | Roach ........................ | 345/90 |
| 5,781,171 A | * | 7/1998 | Kihara et al. .................. | 345/93 |
| 5,796,390 A | * | 8/1998 | DuPont et al. .............. | 345/204 |
| 5,859,627 A | * | 1/1999 | Hoshiya et al. ............. | 345/100 |
| 5,889,504 A | * | 3/1999 | Kihara et al. ................ | 345/100 |
| 5,956,008 A | * | 9/1999 | Kawasaki et al. ............ | 345/93 |
| 6,467,057 B1 | | 10/2002 | Wang et al. ................. | 714/726 |

* cited by examiner

Primary Examiner—Regina Liang
(74) Attorney, Agent, or Firm—Jiang Chyun IP Office

(57) ABSTRACT

A display driving circuit having a plurality of driving stages and driving lines is provided. The driving stages are electrically coupled in serial, and each of the driving stages comprises a conducting path for transmitting an electric signal from the previous driving stage to the next driving stage via the current driving stage. Each of the driving lines respectively corresponds to a driving stage and electrically connects to an output terminal of the corresponding driving stage. The display driving circuit is characterized in that a redundant device is only installed in one part of the driving stages. The redundant device is capable of supplying an extra conducting path to transmit an electric signal from the previous driving stage to the next driving stage via the current driving stage while the original conducting path in the corresponding driving stage is broken.

15 Claims, 3 Drawing Sheets

DISPLAY DRIVING CIRCUIT

CROSS REFERENCE TO RELATED APPLICATIONS

This application claims the priority benefit of Taiwan application serial no. 92108770, filed on Apr. 16, 2003.

BACKGROUND OF INVENTION

1. Field of Invention

The present invention relates to a display driving circuit, and more particularly, to a display driving circuit that is serially connected.

2. Description of Related Art

In recent techniques, when the Liquid Crystal Display (LCD) panel is fabricated, the Low Temperature Polycrystalline Silicon (LTPS) technique is commonly used to fabricate the Thin Film Transistor (TFT), which is disposed on a glass substrate. However, the yield rate of the fabrication process of the driving circuit which is used for driving each pixel, including the scanning driving circuit and the data driving circuit, is not yet fully stable when such fabrication process is applied. In other words, when this method, currently the most commonly used method, is used to fabricate the LCD panel, serious problems happen, such as an unstable yield rate of the driving circuit.

As shown in FIG. 1, the driving circuit of the LCD panel is usually comprised of a plurality of serially connected shift registers. Herein, each of the shift registers 102, 104, and 106 is one of the components that respectively constitute the driving circuit 10. When each of the pixels on the LCD panel is being driven, a start signal ST is first transmitted to the shift register 102. After a predetermined period of time (normally a clock signal) has passed, the start signal ST is transmitted from the shift register 102 to the shift register 104. Similarly, the start signal ST is sequentially transmitted from the shift register 104 to the shift register 106 and other subsequent shift registers in the same manner. Further, each of the pixels is driven by the driving line 112, 114, and 116, which is electrically coupled respectively to the output terminal of the shift register 102, 104, and 106.

Since the physical circuit of the driving circuit 10 is configured by a plurality of serially connected shift registers, if the circuit of one of the shift registers has some problem, it affects the operation of the subsequent shift registers. In this case, the problem of the unstable yield rate of the driving circuit due to the LTPS fabrication process becomes a problem that urgently needs to be addressed.

SUMMARY OF INVENTION

It is an object of the present invention to provide a display driving circuit which is able to solve the problem of the unstable yield rate of the driving circuit with very little circuit cost.

A display driving circuit having a plurality of driving stages and driving lines is provided. The driving stages are electrically coupled in serial, and each of the driving stages comprises a conducting path for transmitting an electric signal from the previous driving stage to the next driving stage via the current driving stage. Each of the driving lines respectively corresponds to a driving stage and electrically connects to an output terminal of the corresponding driving stage. The display driving circuit is characterized in that a redundant device is only installed in each one of redundant stages. The redundant device is capable of supplying an extra conducting path to transmit an electric signal from the previous driving stage to the next driving stage via the current driving stage while the original conducting path in the corresponding driving stage is broken.

In a preferred embodiment of the present invention, the redundant device is added into a redundant stage subsequent to a plurality of preceding driving stages that are installed separately departing from a predetermined number of the driving stages with each other. Further, the redundant device is added into a plurality of contiguous redundant stages respectively subsequent to a plurality of preceding driving stages that are installed separately departing from a predetermined number of the driving stages with each other.

The present invention adopts a configuration of separately disposing the redundant devices in redundant stages, thus it can increase the possibility of solving the circuit malfunction problem due to the broken circuit in one aspect, and also reduce the possibility of the short circuit problem due to the redundant devices being installed in all driving stages.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In order to reduce the broken circuit problem due to the yield rate variance in fabricating the driving circuit, a very complicated debugging circuit has been proposed, such as the one disclosed in the U.S. Pat. No. 6,467,057. Further, a simple method in which a plurality of parallel-connected replacement devices is added to all of the driving stages is also disclosed, so as to solve the broken circuit problem.

However, in accordance with the technical contents in the U.S. Pat. No. 6,467,057, a very big size and complicated circuit has to be added in each of the driving stages, thus the circuit fabrication cost is increased. Further, in the current time when the integration density of the electronic elements is getting higher and higher now, the more electronic elements there are to be integrated in the same size of the chip, the greater is the possibility that electric leakage is generated and the more advanced fabrication process is needed to be developed. All of these problems are disadvantageous of using such technique.

Reviewing the second solution, although adding a plurality of parallel-connected replacement devices to all of the driving stages does reduce the possibility of the circuit broken, the cost of the extra added parallel-connected replacement devices and the short circuit problem due to too many replacement devices being installed are the concerns of using such method.

Therefore, it is an endeavor of the present invention to have the maker enjoy the most benefits under the conditions of not increasing too much the integration density and also taking into account the possibility of the circuit being broken or the circuit being shorted.

Figure 1:
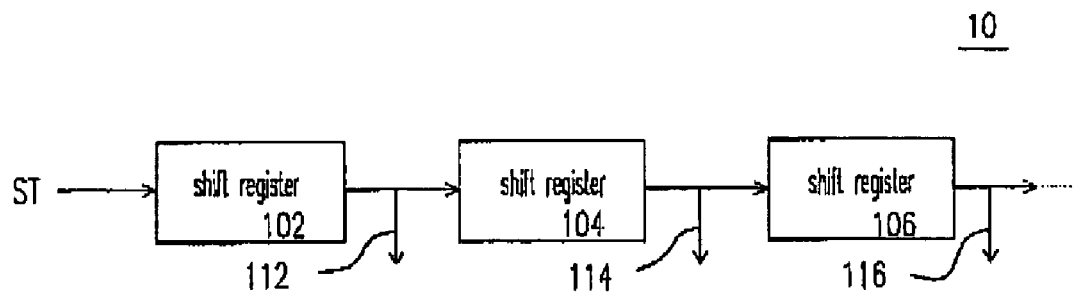
FIG. 1 schematically shows a block diagram of a driving circuit used in the prior art.
Figure 2:
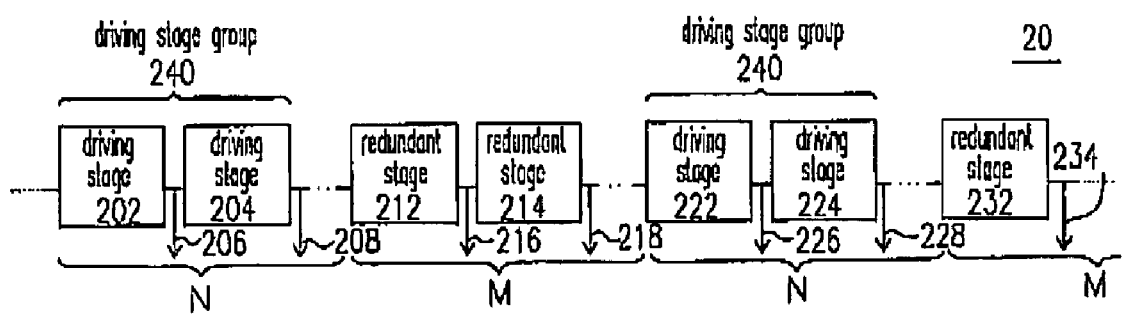
FIG. 2 schematically shows a block diagram of a driving circuit of a preferred embodiment according to the present invention.

FIG. 2 schematically shows a configuration diagram of a simple system of a preferred embodiment according to the present invention. In the present embodiment, the driving circuit 20 comprises a plurality of general driving stages 202, 204, 222, and 224, a plurality of redundant stages 212, 214, and 232, which have redundant devices installed in them, and a plurality of driving lines 206, 208, 216, 218, 226, 228, and 234, which are electrically connected to the output terminals of the corresponding driving or redundant stages 202, 204, 212, 214, 222, 224, and 232. A plurality of driving stage groups 240 are electrically coupled in serial, and each of the driving stage groups 240 comprises a plurality of driving stages 202 and 204, or 222 and 224. The redundant stages 212 and 214 are alternatively disposed between the driving stage groups 240 and electrically coupled to adjacent driving stage group 240, and each of the redundant stages 212, 214 comprises a conducting path. Wherein, the driving stages 202 and 204 constitute a first portion of the driving circuit, and this portion of the driving circuit comprises N driving stages. The redundant stages 212 and 214 constitute a second portion of the driving circuit, and this portion of the driving circuit comprises M driving stages. The driving stages 222 and 224 constitute a third portion of the driving circuit, and this portion of the driving circuit comprises N driving stages, as the same as the first portion of the driving circuit. The redundant stage 232 constitutes a fourth portion of the driving circuit, and this portion of the driving circuit comprises M driving stages, as the same as the second portion of the driving circuit.

Although the configuration of the present invention adds the M number of the redundant stages having the redundant devices subsequent to N number of the preceding general driving stages. However, it is not the only solution. It will be apparent to one of ordinary skill in the art that more redundant stages having the redundant devices can be disposed in the area where the poor yield rate frequently happens in the fabrication process. Contrariwise, for the area where the yield rate is better, the usage of the redundant devices should be minimized as much as possible. Therefore, the problems of the fabrication cost and the impact of the short circuit and broken circuit can be all considered.

Figure 3:
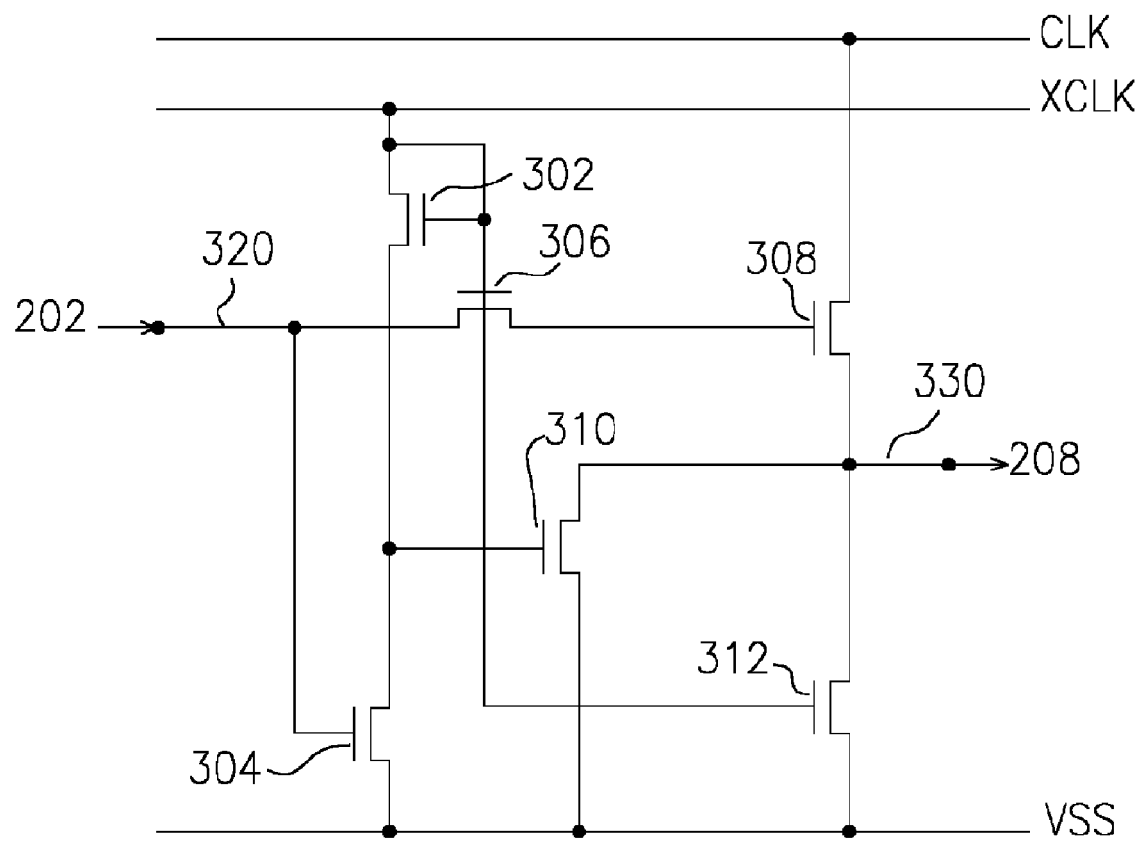
FIG. 3 schematically shows a circuit diagram of a circuit suitable for use in a general driving stage of a preferred embodiment according to the present invention.

A circuit for use in the general driving stage of the present invention is shown in FIG. 3, such circuit can be used as the driving stages 202, 204, 222, and 224 as shown in FIG. 2. The circuit in FIG. 3 which replaces the driving stage 204 in FIG. 2, is exemplified herein for explaining the connection relationship of this circuit. In FIG. 3, the driving stage 204 comprises six transistors 302-312. Wherein, a source/drain electrode and a gate electrode of the transistor 302 are jointly electrically coupled to an inverse clock signal line XCLK, and the other source/drain electrode is electrically coupled to a source/drain electrode of the transistor 304. Besides having a source/drain electrode that is electrically coupled to the transistor 302, the transistor 304 also has a gate electrode that is electrically coupled to a signal input circuit 320 that is used for inputting a signal from the driving stage 204, and the other source/drain electrode which is electrically coupled to a negative operating voltage VSS. A gate electrode of the transistor 306 is electrically coupled to the inverse clock signal line XCLK, a source/drain electrode is electrically coupled to the signal input circuit 320, and the other source/drain electrode is electrically coupled to a gate electrode of the transistor 308. Besides the gate electrode being electrically coupled to the transistor 306, the transistor 308 also has a source/drain electrode that is electrically coupled to the clock signal line CLK; and the other source/drain electrode, which is electrically coupled to a signal output circuit 330 that is used for outputting a signal to the driving line 208. A gate electrode of the transistor 310 is electrically coupled to a source/drain electrode with which the transistor 302 and the transistor 304 are electrically coupled; a source/drain electrode is electrically coupled to the signal output circuit 330; and the other source/drain electrode is electrically coupled to the negative operating voltage VSS. A gate electrode of the transistor 312 is electrically coupled to the inverse clock signal line XCLK; a source/drain electrode is electrically coupled to the signal output circuit 330; and the other source/drain electrode is electrically coupled to the negative operating voltage VSS.

Figure 4:
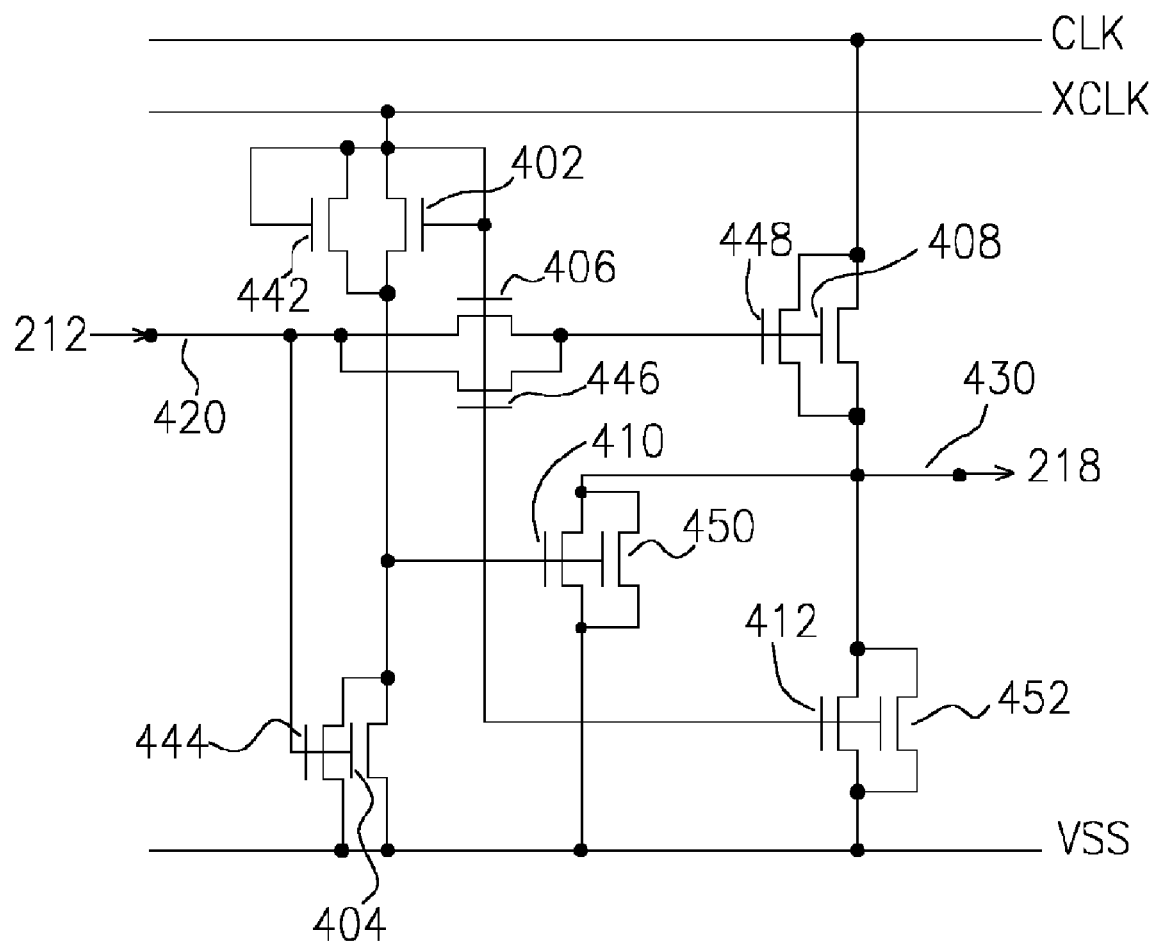
FIG. 4 schematically shows a circuit diagram of a circuit suitable for use in a driving stage having a redundant device of a preferred embodiment according to the present invention.

FIG. 4 schematically shows a circuit diagram of a circuit suitable for use in a driving stage having a redundant device of the present invention. Wherein, the redundant device comprises six transistors 442, 444, 446, 448, 450, and 452, and these driving stages can be used as the redundant stages 212, 214, and 232 as shown in FIG. 2. The circuit in FIG. 4 which replaces the redundant stage 214 in FIG. 2, is exemplified herein for explaining the connection relationship of this circuit.

Comparing to FIG. 3, the transistors 402, 404, 406, 408, 410, and 412 as shown in FIG. 4 are disposed on the same location of the driving stage circuit as the transistors 302, 304, 306, 308, 310, and 312 as shown in FIG. 3, respectively. Further, the transistor 442 is coupled in parallel with the transistor 402 wherein a source/drain electrode and a gate electrode are jointly electrically coupled to an inverse clock signal line XCLk; and the other source/drain electrode is electrically coupled to a source/drain electrode of the transistors 404 and 444. The transistor 444 is coupled in parallel with the transistor 404; besides a source/drain electrode is electrically coupled to the transistor 442. Its gate electrode is electrically coupled to a signal input circuit 420 that is used for inputting a signal from the redundant stage 212, and the other source/drain electrode is electrically coupled to a negative operating voltage VSS. A gate electrode of the transistor 446 is electrically coupled to the inverse clock signal line XCLK; a source/drain electrode is electrically coupled to the signal input circuit 420; and the other source/drain electrode is electrically coupled to the gate electrode of the transistors 408 and 448. The transistor 448 is coupled in parallel with the transistor 408; a gate electrode is electrically coupled to the transistor 446. Its source/drain electrode is electrically coupled to a clock signal line CLK, and the other source/drain electrode is electrically coupled to a signal output circuit 430 that is used for outputting a signal to the driving line 218. The transistor 450 is coupled in parallel with the transistor 410, and its gate electrode is electrically coupled to a source/drain electrode with which the transistor 442 and the transistor 444 are electrically coupled. Wherein a source/drain electrode is electrically coupled to the signal output circuit 430, and the other source/drain electrode is electrically coupled to the negative operating voltage VSS. The transistor 452 is coupled in parallel with the transistor 412; and its gate is electrically coupled to the inverse clock signal line XCLK, a source/drain electrode is electrically coupled to the signal output circuit 430; and the other source/drain electrode is electrically coupled to the negative operating voltage VSS.

Briefly speaking, the present invention adds at least one extra same type element in parallel with the original circuit element. Therefore, when the broken circuit problem occurs in one of the elements, the other element is used to provide a conducting path.

In summary, the present invention adds the redundant device in parallel with the original circuit, and by using the configuration of separately disposing the redundant devices, so as to reduce the problem of the broken circuit in the general driving stage, and also reduce the short circuit problem that is additionally caused by disposing redundant devices in all driving stages. Therefore, the present invention is capable of reducing the circuit malfunction problem due to the broken circuit in one aspect, and also capable of reducing the short circuit problem due to the redundant devices are installed in all driving stages.

Although the invention has been described with reference to a particular embodiment thereof, it will be apparent to one of ordinary skill in the art that modifications to the described embodiment may be made without departing from the spirit of the invention. Accordingly, the scope of the invention will be defined by the attached claims not by the above detailed description.

The invention claimed is:

1. A display driving circuit, comprising:
   a plurality of first driving stages;
   a plurality of redundant stages, alternatively disposed between the driving stages and electrically coupled to adjacent driving stages in serial, wherein each of the redundant stage having a second driving stage installed with a redundant device in parallel, comprises a conducting path so as to transmit an electric signal from the previous first driving stage to the next first driving stage; and
   a plurality of driving lines, wherein each of the driving lines corresponds to one of the first driving stages or the redundant stages respectively, and each of the driving line is electrically coupled to an output terminal of a corresponding first driving stage or a corresponding redundant stage.

2. The display driving circuit of claim 1, wherein each pair of two adjacent redundant stages further comprises at least one another driving stage electrically coupled therebetween.

3. The display driving circuit of claim 1, wherein the redundant device comprises a plurality of transistors electrically coupled in parallel with transistors in the second driving stage.

4. The display driving circuit of claim 3, wherein the redundant device is capable of supplying an extra conducting path to transmit an electric signal from the previous first driving stage to the next first driving stage via the current redundant stage while the original conducting path in the corresponding second driving stage of the redundant stage is broken.

5. The display driving circuit of claim 3, wherein the second driving stage comprises six transistors.

6. A display driving circuit, comprising:
   a plurality of driving stage groups, and each of the driving stage groups comprises a plurality of first driving stages electrically coupled in serial;
   a plurality of redundant stages, alternatively disposed between the driving stages group and electrically coupled to adjacent driving stages group in serial, wherein each of the redundant stage having a second driving stage installed with a redundant device in parallel, comprises a conducting path so as to transmit an electric signal from the previous driving stage group to the next driving stage group; and
   a plurality of driving lines, wherein each of the driving lines corresponds to one of the first driving stages or the redundant stages respectively, and each of the driving line is electrically coupled to an output terminal of a corresponding first driving stage or a corresponding redundant stage.

7. The display driving circuit of claim 6, wherein the redundant device comprises a plurality of transistors electrically coupled in parallel with transistors in the second driving stage.

8. The display driving circuit of claim 7, wherein the redundant device is capable of supplying an extra conducting path to transmit an electric signal from the previous first driving stage to the next first driving stage via the current redundant stage while the original conducting path in the corresponding second driving stage of the redundant stage is broken.

9. The display driving circuit of claim 7, wherein the second driving stage comprises six transistors.

10. The display driving circuit of claim 6, wherein the driving stage group includes N number of a plurality of first driving stages, and the redundant stage is electrically connected subsequent to the driving stage group.

11. The display driving circuit of claim 6, wherein the first driving stage comprises:
    a first transistor, having a gate electrically coupled to an input terminal, a first source/drain electrode electrically coupled to a power supply and a second source/drain electrode;
    a second transistor, having a gate electrically coupled to a first clock terminal, a first source/drain electrode electrically coupled to the gate of the second transistor, and a second source/drain electrode electrically coupled to the second source/drain electrode of the first transistor;
    a third transistor, having a gate electrically coupled to the gate of the second transistor, a first source/drain electrode electrically coupled to the input terminal and a second source/drain electrode;
    a fourth transistor, having a gate electrically coupled to the second source/drain electrode of the first transistor, a first source/drain electrode electrically coupled to the power supply and a second source/drain electrode electrically coupled to an output terminal;
    a fifth transistor, having a gate electrically coupled to the second source/drain electrode of the third transistor, a first source/drain electrode electrically coupled to a second clock terminal and a second source/drain electrode electrically coupled to the output tenninal; and
    a sixth transistor, having a gate electrically coupled to the gate of the third transistor, a first source/drain electrode electrically coupled to the power supply and a second source/drain electrode electrically coupled to the output terminal.

12. The display driving circuit of claim 11, wherein the first transistor, the second transistor, the third transistor, the fourth transistor, the fifth transistor and the sixth transistor are NMOS transistors.

13. The display driving circuit of claim 11, wherein the redundant stage comprises:

a seventh transistor, having a gate electrically coupled to an input terminal, a first source/drain electrode electrically coupled to a power supply and a second source/drain electrode;

an eighth transistor, having a gate electrically coupled to a first clock terminal, a first source/drain electrode electrically coupled to the gate of the eighth transistor and a second source/drain electrode electrically coupled to the second source/drain electrode of the seventh transistor;

a ninth transistor, having a gate electrically coupled to the gate of the eighth transistor, a first source/drain electrode electrically coupled to the input terminal and a second source/drain electrode;

a tenth transistor, having a gate electrically coupled to the second source/drain electrode of the seventh transistor, a first source/drain electrode electrically coupled to the power supply and a second source/drain electrode electrically coupled to an output terminal;

an eleventh transistor, having a gate electrically coupled to the second source/drain electrode of the ninth transistor, a first source/drain electrode electrically coupled to a second clock terminal and a second source/drain electrode electrically coupled to the output terminal;

a twelfth transistor, a gate electrically coupled to the gate of the ninth transistor, a first source/drain electrode electrically coupled to the power supply and a second source/drain electrode electrically coupled to the output terminal;

a thirteenth transistor, having a gate electrically coupled to the gate of the seventh transistor, a first source/drain electrode electrically coupled to the first source/drain electrode of the seventh transistor and a second source/drain electrode electrically coupled to the second source/drain electrode of the seventh transistor;

a fourteenth transistor, having a gate electrically coupled to the gate of the eighth transistor, a first source/drain electrode electrically coupled to the first source/drain electrode of the eighth transistor and a second source/drain electrode electrically coupled to the second source/drain electrode of the eighth transistor;

a fifteenth transistor, having a gate electrically coupled to the gate of the ninth transistor, a first source/drain electrode electrically coupled to the first source/drain electrode of the ninth transistor and a second source/drain electrode electrically coupled to the second source/drain electrode of the ninth transistor;

a sixteenth transistor, having a gate electrically coupled to the gate of the tenth transistor, a first source/drain electrode electrically coupled to the first source/drain electrode of the tenth transistor, a second source/drain electrode electrically coupled to the second source/drain electrode of the tenth transistor;

a seventeenth transistor, having a gate electrically coupled to the gate of the eleventh transistor, a first source/drain electrode electrically coupled to the first source/drain of the eleventh transistor and a second source/drain electrode electrically coupled to the second source/drain electrode of the eleventh transistor; and an eighteenth transistor, having a gate electrically coupled to the gate of the twelfth transistor, a first source/drain electrode electrically coupled to the first source/drain electrode of the twelfth transistor and a second source/drain electrode electrically coupled to the second source/drain electrode of the twelfth transistor.

14. The display driving circuit of claim 13, wherein the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, the seventeenth transistor and the eighteenth transistor are NMOS transistors.

15. The display driving circuit of claim 6, wherein a structure of the second driving stage is the same as a structure of the first driving stage.

* * * * *